United States Patent [19]
Bower et al.

[11] Patent Number: 4,795,721
[45] Date of Patent: Jan. 3, 1989

[54] WALLED SLOT DEVICES AND METHOD OF MAKING SAME

[75] Inventors: Robert W. Bower, Maui, Hi; Christopher O. Schmidt, San Antonio, Tex.

[73] Assignee: Advanced Micro Devices, Inc., Sunnyvale, Calif.

[21] Appl. No.: 897,685

[22] Filed: Aug. 18, 1986

Related U.S. Application Data

[63] Continuation-in-part of Ser. No. 576,659, Feb. 3, 1984, abandoned.

[51] Int. Cl.[4] .................................................. H01L 29/06
[52] U.S. Cl. .................................... 437/67; 437/904; 437/909; 437/913; 437/78
[58] Field of Search ........................ 156/644; 357/55; 437/67, 78, 904, 909, 913

[56] References Cited

U.S. PATENT DOCUMENTS

| | | | |
|---|---|---|---|
| 3,681,668 | 8/1972 | Kobayashi | 357/59 |
| 3,703,420 | 11/1972 | Vora | 357/35 |
| 3,762,966 | 10/1973 | Engeler et al. | 357/36 |
| 4,062,034 | 12/1977 | Matsushita et al. | 357/16 |
| 4,104,086 | 8/1978 | Bondur et al. | 357/50 |
| 4,139,442 | 2/1979 | Bondur et al. | 357/50 |
| 4,302,763 | 11/1981 | Ohuchi et al. | 357/59 |
| 4,333,227 | 6/1982 | Horng et al. | 437/67 X |
| 4,339,767 | 7/1982 | Horng et al. | 357/44 |
| 4,392,149 | 7/1983 | Horng et al. | 357/59 |
| 4,419,150 | 12/1983 | Soclof | 357/35 |
| 4,484,211 | 11/1984 | Takemoto et al. | 357/50 |

FOREIGN PATENT DOCUMENTS

| | | | |
|---|---|---|---|
| 0068072 | 5/1983 | European Pat. Off. | 357/50 |
| 54-116884 | 9/1979 | Japan | 357/50 |
| 57-11150 | 3/1982 | Japan | 357/50 |
| 57-201070 | 9/1982 | Japan | 357/50 |
| 0232440 | 12/1984 | Japan | 29/576 W |

OTHER PUBLICATIONS

Barbee et al., "All Ion-Implant Bipolar Transistor Process", IBM Tech. Disc. Bull., vol. 24, (1981), pp. 3409–3412.

Lillja et al., "Process for Fabrication of Shallow and Deep Silicon Dioxide Filled Trenches", *IBM Technical Disclosure Bulletin*, vol. 22, No. 11, Apr., 1980, pp. 4900–4902.

Wang et al., "Reactive-Ion Etching Eases Restrictions on Materials and Feature Sizes", *Electronics*, Nov. 3, 1983, pp. 157–161.

Minegishi et al., "A Sub-Micron CMOS Megabit Level Dynamic Ram Technology Using a Doped Face Trench Capacitor Cell", *Proceedings, IEDM*, 1983, pp. 319–322.

Morie et al., "Depletion Trench Capacitor Technology for Megabit Level MOS dRAM", *IEEE EDL*, vol. EDL-4, No. 11, Nov., 1983, pp. 411–413.

*Primary Examiner*—Olik Chaudhuri
*Attorney, Agent, or Firm*—John P. Taylor

[57] ABSTRACT

An improved integrated circuit structure is disclosed which comprises a substrate having one or more active device slots with active elements of an active device formed therein and an isolation slot surrounding the one or more active device slots with an inner wall contiguous with the outer wall of the one or more active device slots. The active elements in the one or more active device slots are thereby in direct contact with isolation material in the isolation slot to thereby inhibit end effects.

16 Claims, 11 Drawing Sheets

WALLED SLOT DEVICES AND METHOD OF MAKING SAME

CROSS-REFERENCE TO RELATED APPLICATIONS

This application is a continuation-in-part of Bower U.S. patent application Ser. No. 576,659, filed Feb. 3, 1984abandoned.

BACKGROUND OF THE INVENTION

1. Field of the Invention

This invention relates to an integrated circuit device formed in a slot. More particularly, this invention relates to formation of an integrated circuit device formed in one or more active device slots with walled isolation sides formed by locating the active device slots contiguous with adjacent isolation slots.

2. Discussion of the Prior Art

Advances in lithography have permitted line width resolution to reach micron dimensions and processing techniques have improved to the point where the reliable formation of thin films and precise etching are both possible so that smaller and more predictable feature sizes can be obtained. As a consequence, the lateral dimensions of devices are reaching micron levels and passing on into nanometer ranges resulting in a continued decrease in the ensuing density of integrated circuits.

Thus, a greater number of individual devices can be fabricated in a given area. While further increases in areal density are likely, physical, equipment, and process limits are being approached.

In addition, as devices become smaller and smaller, their power ratings are reduced and the relative importance of problems such as parasitic capacitance and contamination is increased. Due to the diminishing return to be obtained from further efforts to improve areal density, it has become desirable to consider the possibility of increasing the extent of the active regions in the vertical dimension to thereby obtain performance for a device with established lateral dimensions which is equivalent to the performance of a device with greater lateral dimensions. Also higher power or higher performance devices may be obtained in this way.

As the densities of integrated circuits have increased, there has been serious consideration of using trench or slot formation processes for forming the insulating zones between individual transistors. Such an isolation technique is described in Bondur et al U.S. Pat. No. 4,104,086. This isolation technique is also described in Bonn U.S. patent Ser. No. 719,085 and Gwozdz U.S. patent application Ser. No. 759,621, both of which applications are assigned to the assignee of this application.

In addition to forming slots in semiconductor wafers for isolating individual devices, slots have also been considered for use as passive circuit elements. For example, it has been proposed that a slot be filled with an appropriate material so that it will function as a capacitor. See, e.g., K. Minegishi et al., "A Sub-Micron CMOS Megabit Level Dynamic RAM Technology Using a Doped Face Trench Capacitor Cell", *Proceedings*, IEDM, 1983, p. 319; and T. Morie et al., "Depletion Trench Capacitor Technology for Megabit Level MOSdRAM", *IEEE Elec tron Device Letters*, v. EDL-4, No. 11, p. 411, Nov. 1983. Such applications are possible because, with appropriate filling materials, a slot can be made to be conductive or insulating as required.

It has also been proposed to construct active devices in slots in a substrate. Fujitsu Japanese Patent Document No. 57-11150 discloses construction of a lateral bipolar transistor wherein an emttter region is formed by diffusing impurities into the walls of a slot formed in a substrate. A collector region is similarly formed using a slot formed in the substrate near the first slot. The substrate portion between the emitter region slot and the collector region slot is said to form the base of the transistor.

In parent application Ser. No. 576,659, assigned to the assignee of this invention and cross-reference to which is hereby made, there is described and claimed the construction of a bipolar transistor using slots in a substrate wherein a base region is first formed in the substrate walls and bottom of a first slot which is then filled with a substance which will form an emitter in the slot to thereby provide a self-aligned structure with a large base-emitter surface junction. A second slot, providing a collector contact region, is formed in the substrate in alignment with, but spaced from, the emitter slot. A buried collector layer, located beneath the portion of the base region formed in the substrate beneath the emitter slot, communicates with the collector contact region.

Such a construction results in a high performance device having lower collector-to-base and collector-to-substrate capacitances due to the respective relationships between the physical collector and base regions and the active collector and base regions.

In that application, an isolation slot was shown formed around the active device to isolate it from nearby active devices in the same substrate. It was also shown, in one embodiment in that application, that the collector slot could be formed as a part of the isolation slot by forming the isolation slot first, forming an isolation oxide on the walls of the slot and refilling the slot, e.g., with polysilicon, and then forming a smaller collector slot within the isolation slot in such a manner as to not disturb the outer isolation oxide wall of the isolation slot.

The use of oxide lined isolation slots to isolate adjoining active devices from one another is also shown in Horng et al U.S. Pat. No. 4,339,767. In that patent isolation slots are formed in the substrate and an epitaxial layer on the substrate to provide electrical isolation between active devices subsequently formed in the epitaxial layer.

However, it would be desirable to construct an active device such as a bipolar transistor completely within a slot or slots in the substrate, as shown in my aforesaid parent application, wherein the active device is not only surrounded by an isolation slot but is formed contiguous with the isolation slot. That is, the isolation slot would form the entire outer wall or walls of the slot or slots containing the active device to thereby not only further conserve space and increase density, but reduce end effects as well.

SUMMARY OF THE INVENTOON

It is, therefore, an object of this invention to provide an integrated circuit structure comprising an active device formed in one or more active device slots with wall isolation of the active elements of the active device.

It is another object of this invention to provide an integrated circuit structure comprising an active device formed in one or more active device slots with wall isolation of the active elements of the active device comprising an isolation slot forming a contiguous outer wall around the active elements in the active device slot.

It is yet another object of this invention to provide a method for making an integrated circuit structure having such wall isolation of the active elements of an active device formed in one or more slots by providing an isolation slot forming a contiguous outer wall around the active elements in the active device slot or slots.

These and other objects of the invention will be apparent from the following description and accompanying drawings.

In accordance with the invention, an improved integrated circuit structure comprises a substrate having one or more active device slots with active elements of an active device formed therein and an isolation slot surrounding the one or more active device slots with an inner wall contiguous with the outer wall of the one or more active device slots whereby the active elements in the one or more active device slots are in direct contact with isolation material in the isolation slot to thereby inhibit end effects.

DESCRIPIION OF THE PREFERRED EMBODIMENTS

While prior integrated circuit structures utilized isolation slots either spaced from the active elements of an active device or merely touching one or more of the active elements at some point, the present invention provides an active device in one or more active device slots in a substrate wherein the surrounding isolation slot or trench is contiguous with the outer walls of the active device slot or slots. This structure and the method of forming the structure serves to both maximize the density of the structure and provide complete isolation of each of the active elements of the device from one another except where desired junctions are formed.

Figure 1:
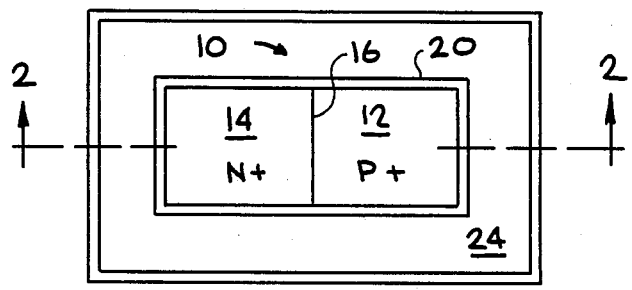
FIG. 1 is a top view in section of an integrated circuit structure constructed in accordance with the invention.
Figure 2:
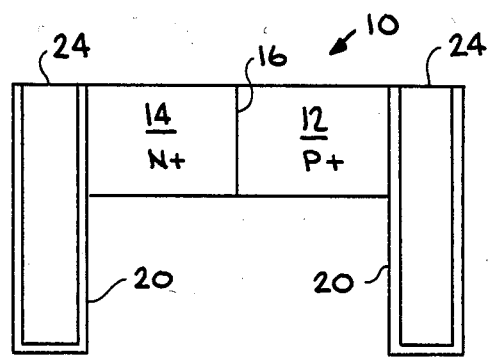
FIG. 2 is a side-section view of the srructure of FIG. 1 taken along lines 2—2.

Turning now to FIGS. 1 and 2, the structure of the invention is illustrated in its simplest form wherein a diode 10 is generally illustrated having a P+ region 12 and an N+ region 14 both completely surrounded and in contact with an oxide layer 20 formed on the wall of an isolation slot 24 except for a junction 16 between regions 12 and 14. In this illustration of the invention, it will be readily seen that maximum density has been achieved since the entire area encompassed or surrounded by isolation slot 24 has been filled by either P+ region 12 or N+ region 14. Furthermore, since all sides of either region 12 or region 14 are contacted by the oxide isolation material 20 lining the walls of isolation slot 24, except for junction 16, there is no possible way for any end effects to occur, i.e., no current may laterally flow from region 14 to region 12 except across junction 16.

This type of integrated circuit structure wherein both active elements of the device are constructed in different but contiguous portions of the same slot is described in further detail and claimed in copending application Ser. No. 897,678, entitled CIRCUIT STRUCTURE WITH ACTIVE DEVICE IN MERGED SLOT AND METHOD OF MAKING SAME", filed on Aug. 18, 1986 and assigned to the assignee of this application.

Figure 3:
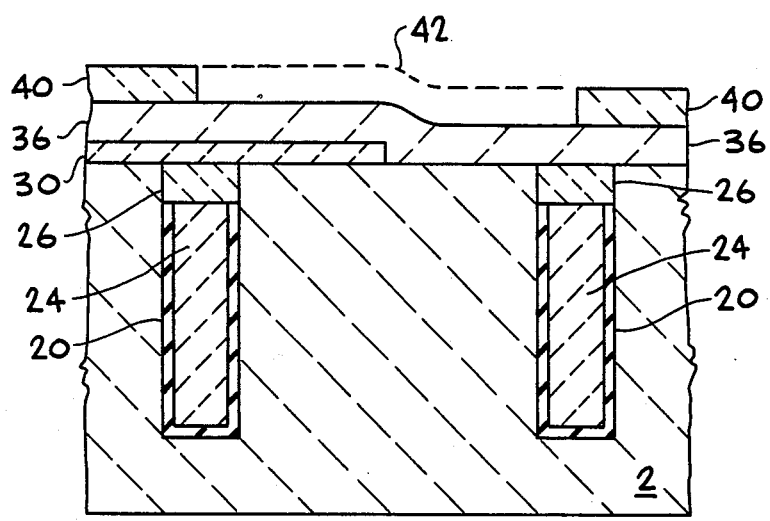
FIGS. 3 and 4 are fragmentary side section views of initial sequential steps in constructing the structure of FIGS. 1 and 2.

Turning now to FIGS. 3 to 12, the sequential steps used in forming the structure of FIGS. 1 and 2 will be described. In FIG. 3, isolation slot 24 has already been formed in substrate 2 and the exposed silicon walls have been oxidized to form the oxide coating 20 thereon. The remannder of the slot may be filled with polysilicon and an oxide cap 26 is then deposited or grown over slot 24. Formation of oxide cap 26 is an important feature of the invention as it will function as a self-aligning mask in subsequent formation of the active device slots as will be described below.

It should be noted that if a buried collector layer is desired, this will be formed prior to formation of isolation slot 24.

Figure 5A:
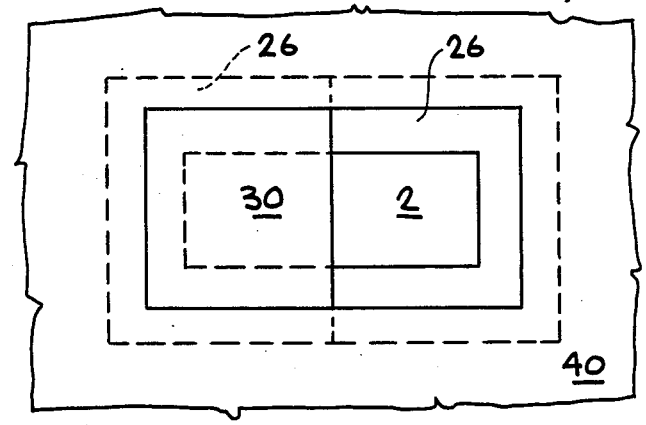
FIG. 5A is a fragmentary top view of the structure after completion of the steps illustrated in FIGS. 3 and 4.

After formation and capping of isolation slot 24, a nitride mask layer 30 is deposited over a portion of the area circumscribed by slot 24 as shown in FIG. 3 and also in FIG. 5A. Nitride mask layer 30 will be used in cooperation with oxide cap 26 to provide the self-aligeed mask for the first active device slot to be formed in substrate 2.

Following application of nitride mask layer 30 to the structure, an oxide layer 40 is formed over the entire structure either by deposition or by first depositing a polysilicon layer 36 over the entire structure and then growing an oxide layer 40 over polysilicon layer 36.

Oxide layer 40 is then patterned to remove the oxide portion 42 defined by the dotted lines in FIG. 3. It will be noted that the patterning of oxide layer 40 need not be precise since the oxide cap 26 and nitride mask layer 30 will provide the self-aligning mask for formation of the active device slots. The patterning of oxide layer 40 is therefore illustrated in FIG. 4 as overlapping oxide cap 26.

Figure 4:
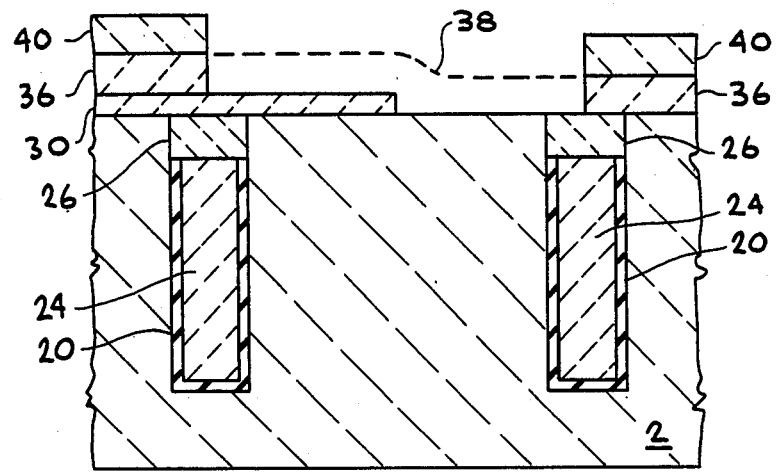
Figure 5B:
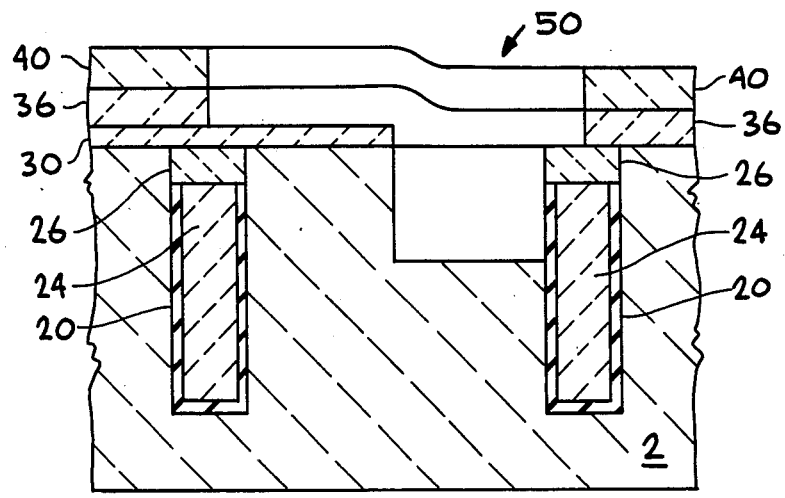
FIG. 5B is a fragmentary side section view of the structure shown in FIG. 5A.

Following the patterning of oxide layer 40, the exposed portion 38 of polysilicon layer 36, shown in dotted lines in FIG. 4, is removed by suitable etching techniques such as a reactive ion etch (RIE) to expose nitried mask 30 and oxide cap 26 as well as the portion of silicon substrate 2 as shown in FIG. 5A. This exposed portion of silicon substrate 2 is then selectively etched to form first active device slot 50 as seen in FIG. 5B. defined by nitride mask 30 and oxide cap 26.

Figure 6:
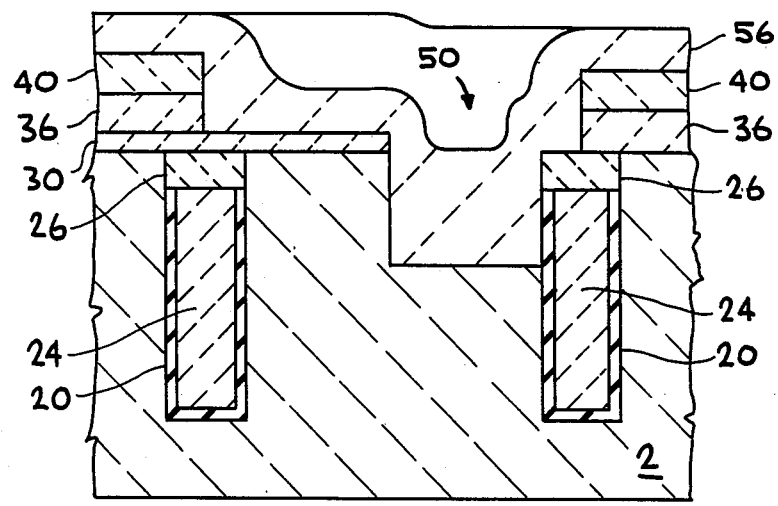
FIGS. 6–13 are fragmentary side section views of sequential steps in forming the structure of the invention illustrated in FIGS. 1 and 2.

A layer 56 of polysilicon or SIPOS is now deposited over the structure as illustrated in FIG. 6 to fill first active slot 50. Layer 56 may comprise previously doped material or layer 56 may be subsequently doped to provide the desired conductivity type which, in the illustrated embodiment, will be a P+ dopant.

Figure 7:
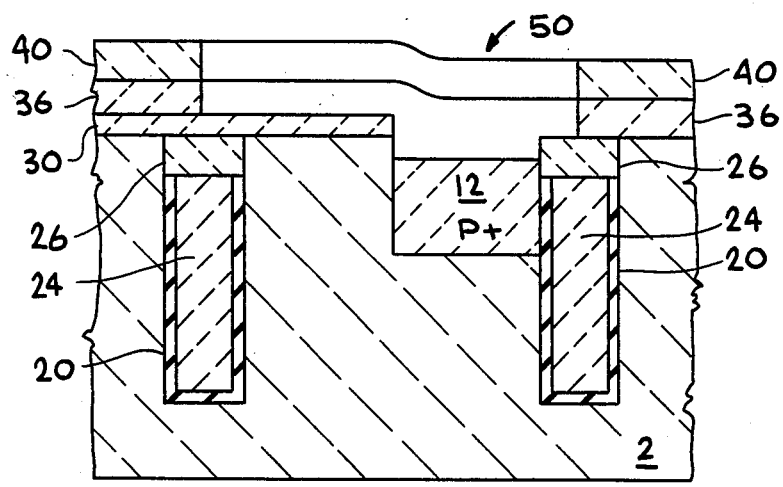
Figure 8:
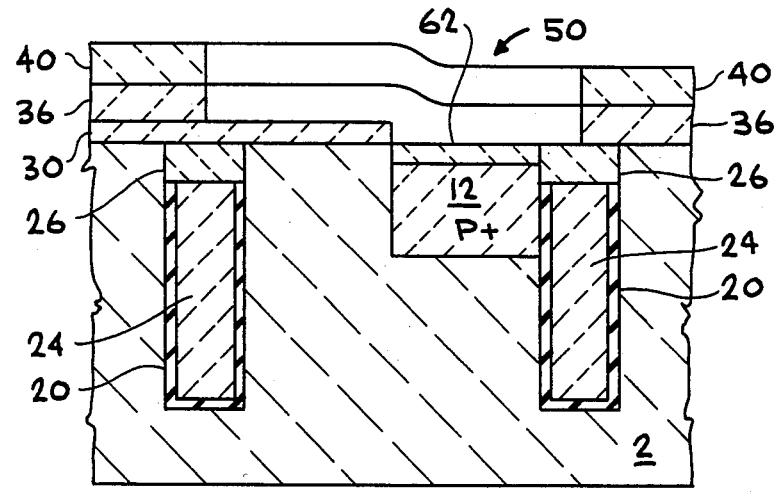

Layer 56 is then planarized as shown in FIG. 7 leaving a remaining portion 12 of polysilicon or SIPOS in slot 50. The surface of polysilicon or SIPOS portion 12 is then oxidized to form a protective oxide layer 62 thereover as shown in FIG. 8. At this point, in accordance with the invention, the P+ material in slot 50 is bounded on three sides by the oxide sidewall material 20 of isolation slot 24 by virtue of the formation of slot 50 using the self-aligning oxide cap mask 26 as explained earlier with reference to FIG. 5A.

Figure 9A:
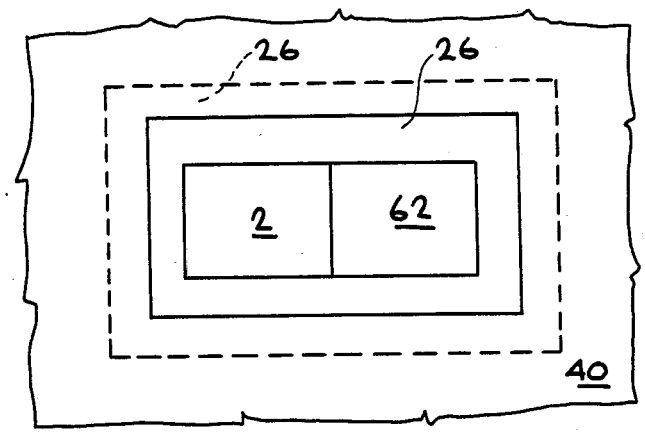
Figure 9B:
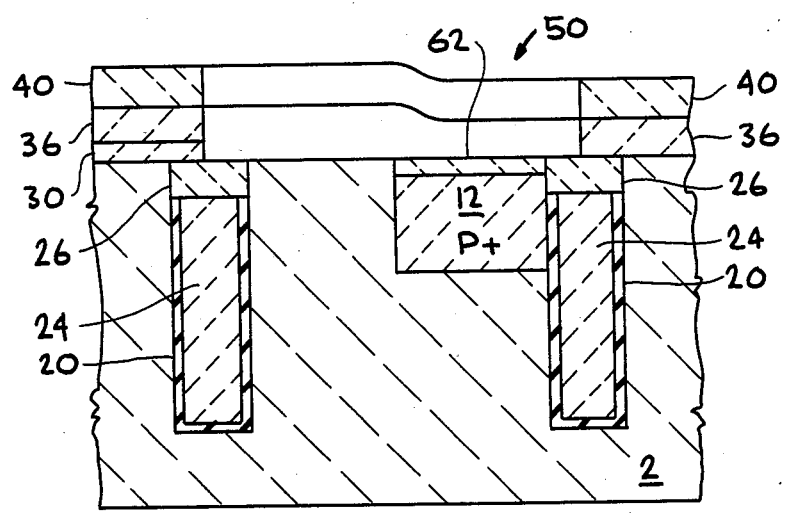
Figure 10:
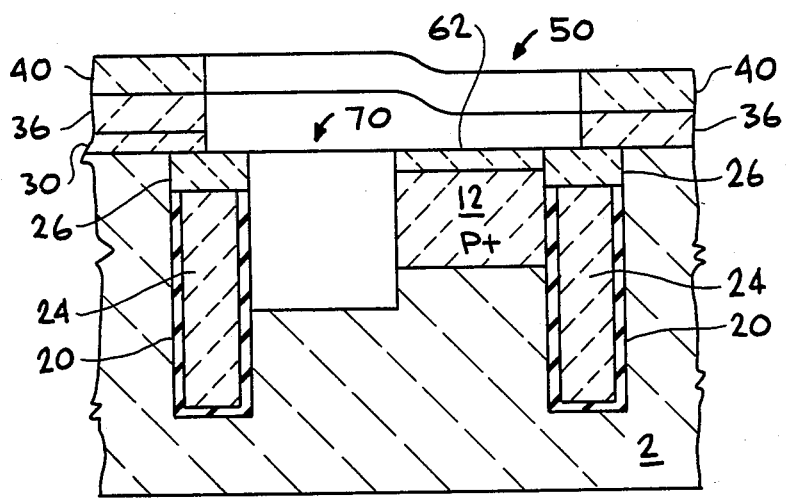

The second active slot is now formed by removing the exposed portion of nitride mask 30 as shown in FIGS. 9A and 9B. Removal of nitride mask 30, in turn, exposes a portion of underlying silicon substrate 2 bounded on three sides by oxide cap 26 over isolation slot 24 and, on the fourth side, by oxide layer 62 over polysilicon or SIPOS material 56 in active device slot 50. Oxide 26 and oxide 62 thus combine to form a self-aligning mask for the formation of second active device slot 70 which is formed by selective etching, e.g., RIE etching of the exposed portion of silicon substrate 2, as seen in FIG. 10.

Figure 11:
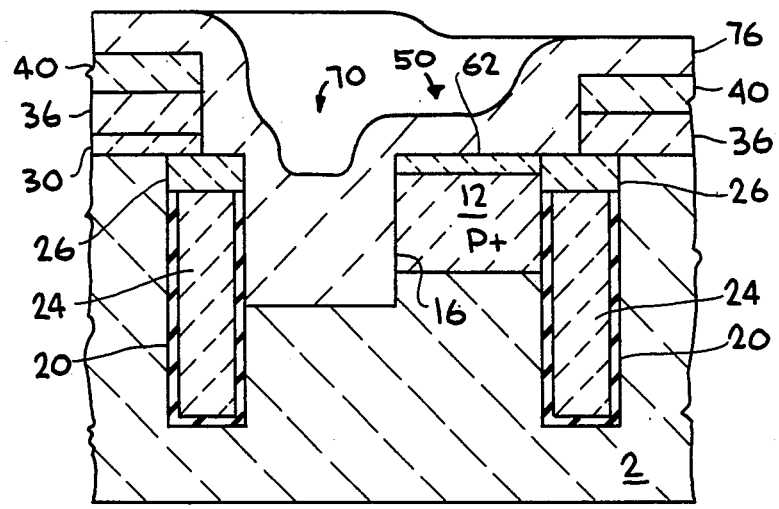

Another layer 76 of semiconductor material such as polysilicon or SIPOS is now deposited over the structure as shown in FIG. 11 and then planarized to leave N+ material 14 in second slot 70. Again the particular doping of layer 76, to provide the desired N+ doping of the illustrated embodiment, may be provided by the use of doped material such as SIPOS or the layer may be doped either prior to or after planarization. The use of previously doped material is preferred, however, to avoid any N doping of P+ material 12 in the adjoining slot. After planarization of layer 76, a protective oxide layer 82 may be formed over N+ material 14 which remains in second active device slot 70.

Figure 12:
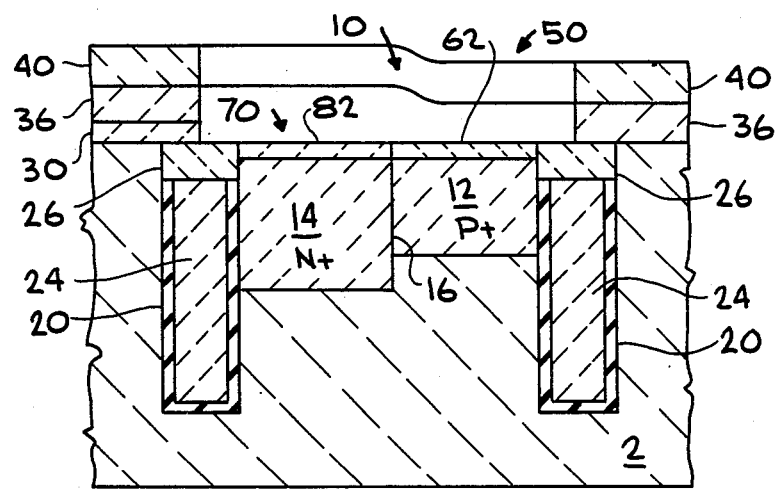

As seen in FIG. 12, the interface or junction 16 formed between P+ material 12 in slot 50 and N+ material 14 in slot 70 forms a diode 10 which is completely surrounded and contiguously bounded by oxide 20 of isolation slot 24 in accordance with the invention as shown earlier in FIGS. 1 and 2.

Figure 13:
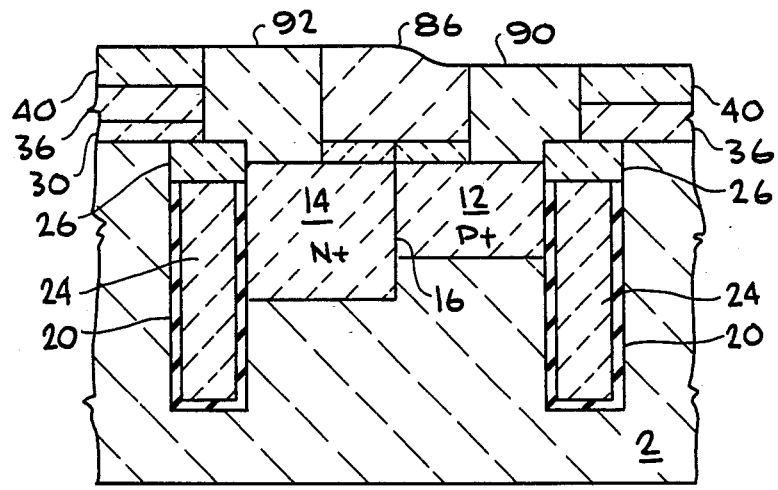
Figure 14:
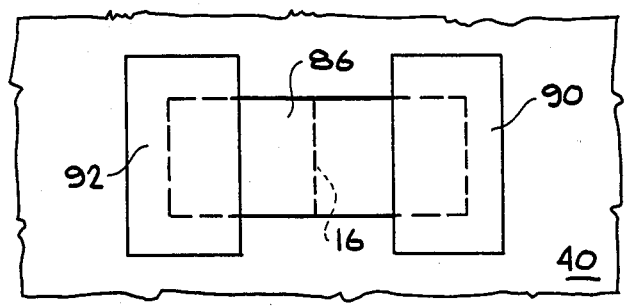
FIG. 14 is a fragmentary top view of the structure shown in FIG. 13.

Referring now to FIGS. 13 and 14, a further layer of oxide 86 may be grown or deposited over the structure and then planarized. Contacts 90 and 92 may then be conventiooally formed to the respective P+ and N+ electrodes 12 and 14 through vias or contact openings in oxide layer 86 to complete formation of the device.

The invention is useful not only with two element devices, such as the P-N device shown, or a Schottky diode, but also in the construction of three element devices such as bipolar transistors formed in one or more active device slots such as described and claimed in the aforementioned parent application Ser. No. 576,659 and in copending application Ser. No. 897,686, entitled "VERTICAL SLOT BOTTOM BIPOLAR TRANSISTOR DEVICE", filed on Aug. 18, 1986 and assigned to the assignee of this invention, wherein there is described and claimed a modification of the aforementioned Ser. No. 576,659 in which the active base and collector regions are both formed beneath the emitter in the emitter slot.

Figure 15:
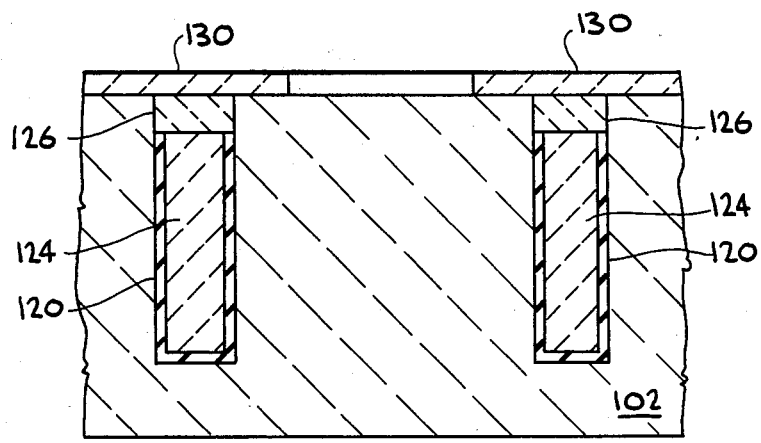

Turning now to FIGS. 15-26, the construction of a bipolar device in accordance with the invention will be described. As shown in FIG. 15, isolation slot 124 has been previously formed in similar fashion to isolation slot 24 previously described with an oxide layer 120 on the walls thereof and an oxide cap 126 over the slot. Isolation slot 124 may comprise a rectangular slot (see the top view in FIG. 25) which will completely and contiguously surround the bipolar transistor.

Figure 16:
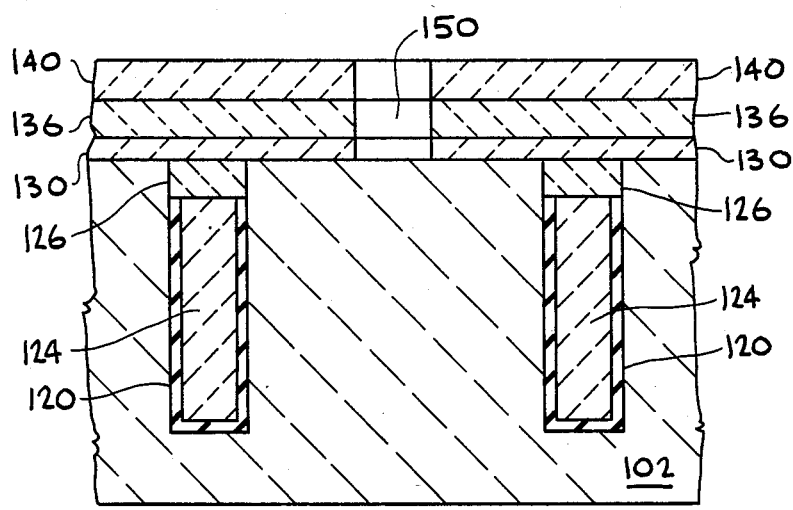
FIGS. 16–24 are fragmentary side section views of sequential steps in forming a bipolar slot device in accordance with the invention.

A nitride mask 130 may then be placed over substrate 102 to define not only the emitter slot but the contact to the extrinsic base adjacent the emitter slot as well. A polysilicon layer 136 and an overlying oxide layer 140 are then formed on substrate 102 and etched, as shown in FIG. 16, to define the latent image 150 of the emitter slot to be formed in substrate 102. Alternatively, the latent image of the collector slots may be formed in oxide layer 140 and polysilicon layer 136 at the same time with nitride layer 130 pemmitting the emitter slot to then be formed in silicon substrate 102 while the collector area remains masked by nitride 130.

Figure 17:
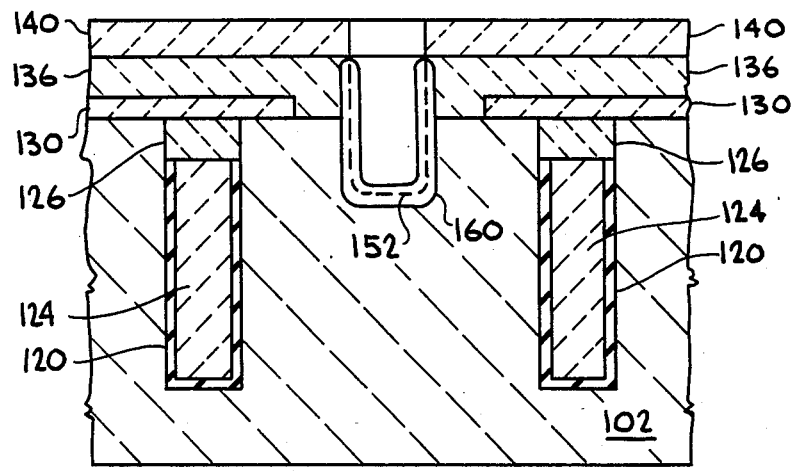

The emitter slot is then partially etched into uubstrate 102 as shown at dotted lines 152 in FIG. 17. The exposed sidewalls of polysilicon layer 136 and the sidewalls and bottom of the partially formed emitter slot in substrtte 102 are then oxidized to form an oxide coating 160 which will serve to isolate the emitter material from the base contact.

Figure 18:
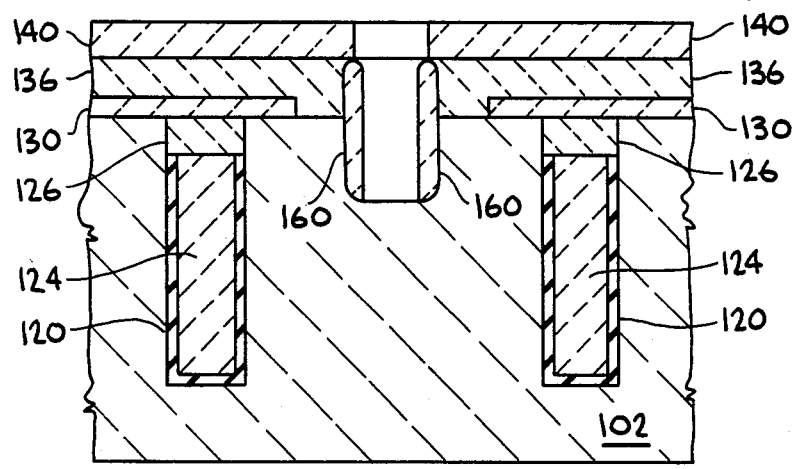
Figure 19:
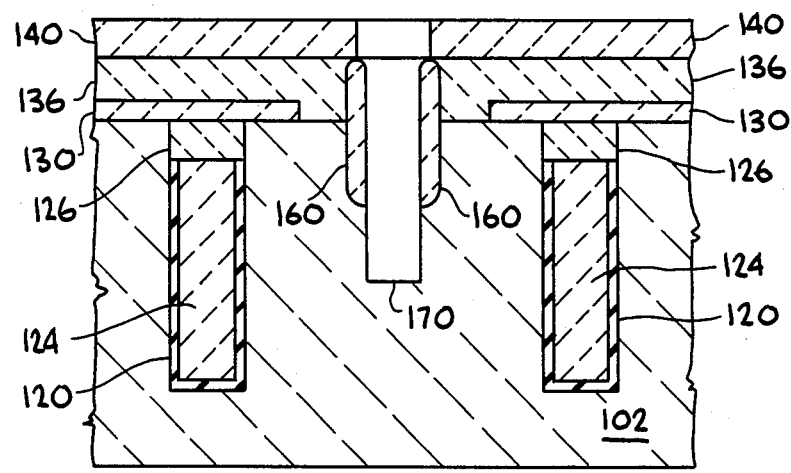
Figure 20:
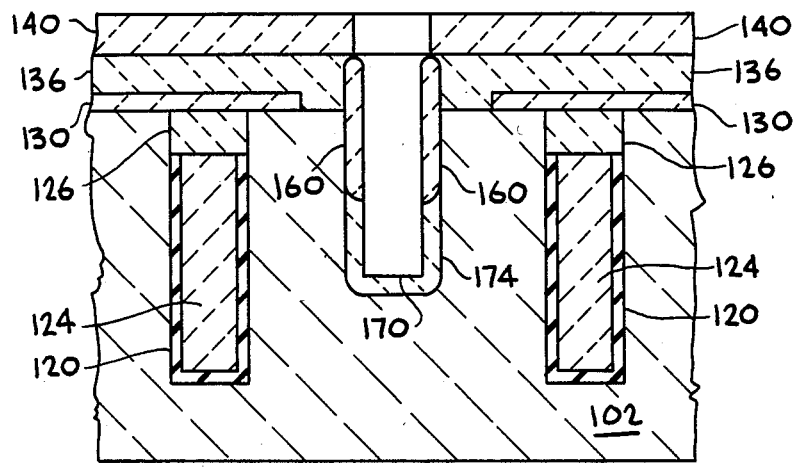
Figure 21:
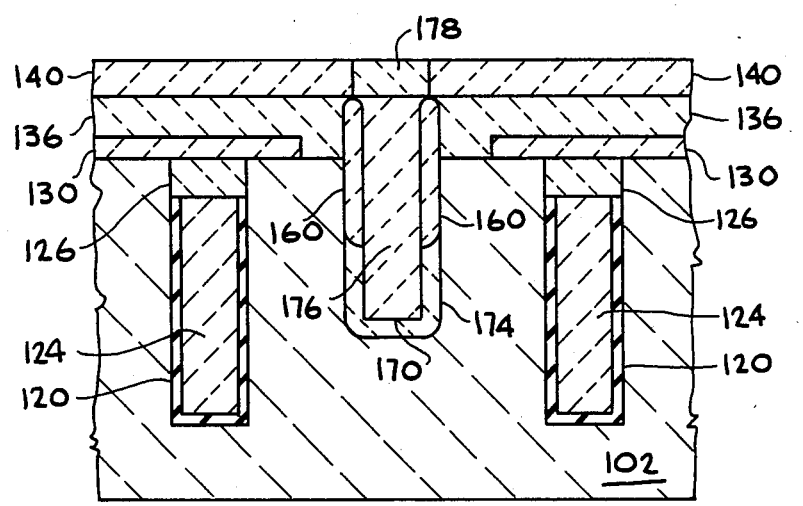

The portion of oxide coating 160 at the bottom of the partially formed emitter slot is then appropriately removed such as by a reactive ion etch (RIE) as shown in FIG. 18 and the remainder of emitter slot 170 is etched into substrate 102 as shown in FIG. 19. Intrinsic base material is then diffused into substrate 102 through the exposed lower portion of the walls of slot 170 to form an intrinsic base region 174 surrounding the portion of emitter slot 170 below the oxide coating 160 as illustrated in FIG. 20. Emitter slot 170 is then filled with doped polysilicon or SIPOS 176 to form the emitter. An oxide cap 178 is then formed over the emitter material 174 in emitter slot 170 as depicted in FIG. 21.

Figure 22:
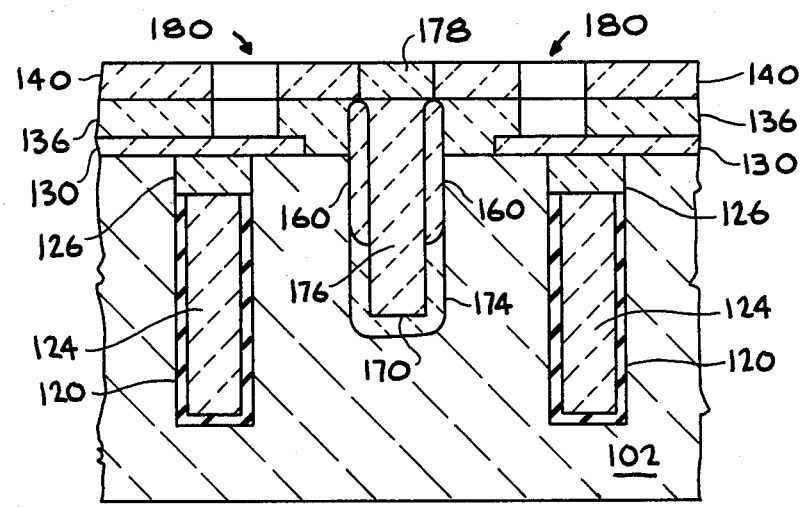
Figure 23:
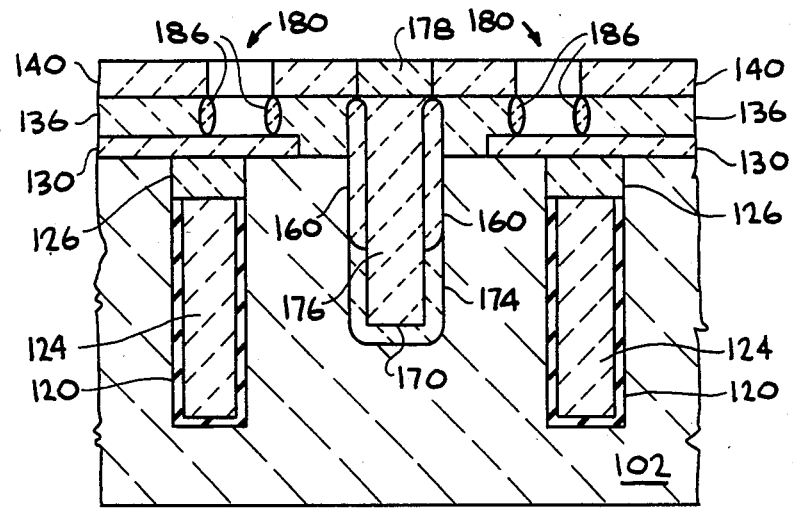

The collector slot or slots are then formed by first forming the latent image 180 of the slots in oxide layer 140 and polysilicon layer 136 as shown in FIG. 22. The exposed edges of polysilicon layer 136 are then oxidized to form isolation oxide portions 186 as illustrated in FIG. 23 to isolate each collector electrode from the adjacent base contact as will be described.

Figure 24:
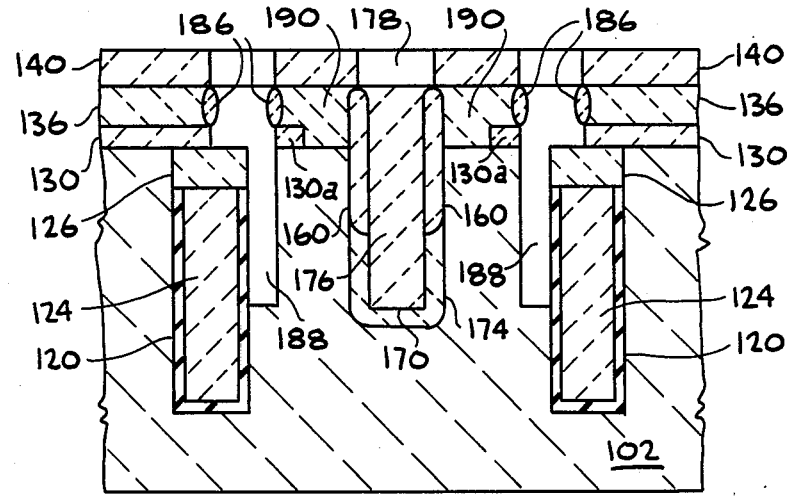
Figure 26:
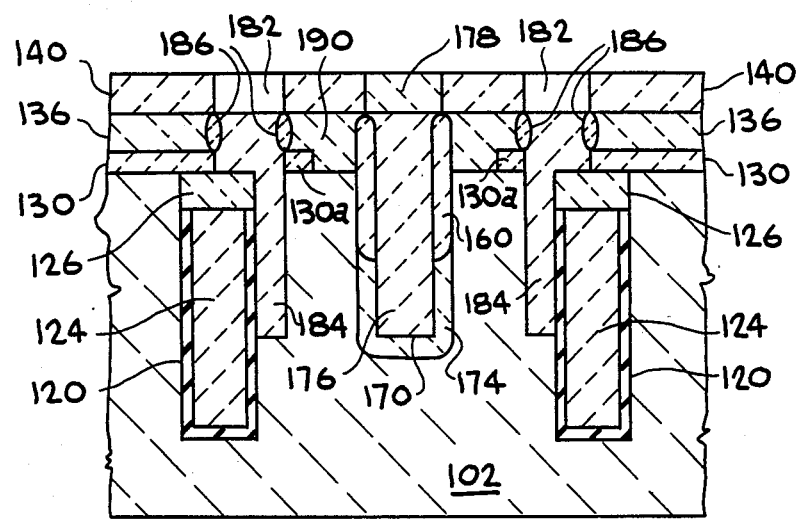
FIG. 26 is a fragmentary side section view of a further step in the sequence of steps to form a slot type bipolar device as illustrated in FIGS. 16–24.

The now exposed portion of nitride layer 130 is then removed and the underlying silicon substrate 102 is etched to form the collector slot or slots 188 as shown in FIG. 24. Collector slots 188 may then be filled with doped polysilicon or SIPOS 184 as shown in FIG. 26.

Formation of the oxide portions 186 on the exposed sidewalls of polysilicon layer 136, and the removal of exposed portions of the nitride layer 130 leaving nitride portions 130a between emitter slot and collector slot 188, combine with oxide 160 to isolate polysilicon portions 190 of polysilicon layer 136 to form base contacts for the underlying extrinsic base as shown in FIG. 24. This extrinsic base portion may be formed by initially doping silicon substrate 102 or it may be formed by appropriate doping of polysilicon layer 136 and subsequent diffusing of the dopant into the underlying substrate.

Figure 25:
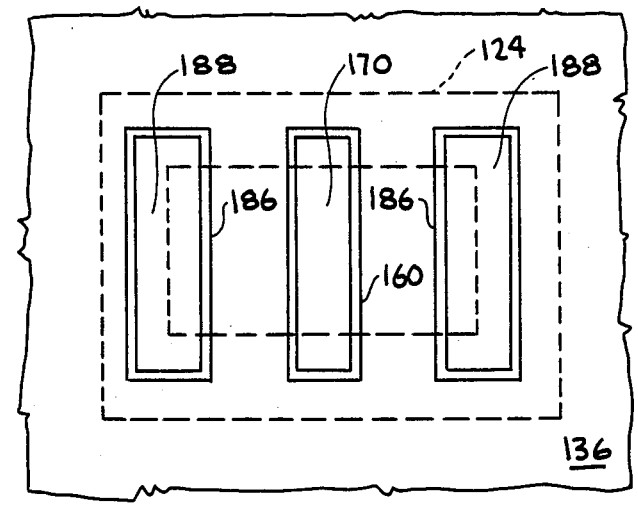
FIG. 25 is a fragmentary top view of the structure of FIG. 24.

As shown in FIG. 25, collector slots 188 are bounded on three sides and emitter slot 170 is bounded on both ends by the walls of isolation slot 124. Thus, isolation slot 124 provides a self-alignment to control the width of the emitter and collector electrodes and to form contiguous insulated walls therewith. Furthermore, as can be seen in FIG. 25, end or edge effects are controlled by providing the ends or widths of the emitter and collector slot electrodes contiguous with isolation slot 124. Current may therefore only flow between the collector and emitter electrodes through the base surrounding the emitter electrode.

The resultant active device, formed in accordance with the invention, is a compact structure with end or edge effect protection due to the contiguous formation of the emitter and collector slots with the walls of isolation slot 124.

It should be noted that the active device i.e., the active device slots, could be formed first. The isolation slot then would be formed adjacent to and contiguous with the slot electrodes of the active device by placing protective oxide caps over the slot electrodes which will permit self-alignment with the isolation slots in similar fashion to the oxide caps 26 and 126 placed over the previously formed isolation caps in the embodiments already described.

Alternatively, as illustrated in FIGS. 27–31, a portion of the isolation slot may be formed first, then the active electrode slots, and then the remainder of the isolation slot to provide more control of the size of the electrodes formed in the active slots due to the self-alignment characteristics of the invention.

Figure 27:
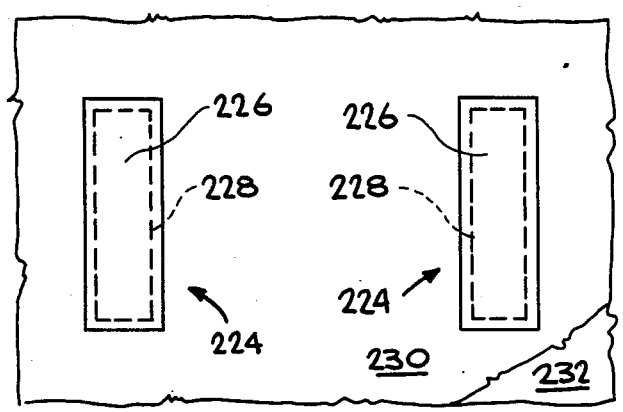
FIG. 27 is a fragmentary top view of an early step in forming yet another embodiment of the invention.

Thus, as shown in FIG. 27, first isolation slot portions 224 may be formed using, for example, a nitride mask 232 patterned by a photoresist layer 230. Isolation slot portions 224 are formed similar to those previously discussed with an oxide wall lining 228, a filler such as polysilicon, and a protective oxide cap 226.

Figure 28:
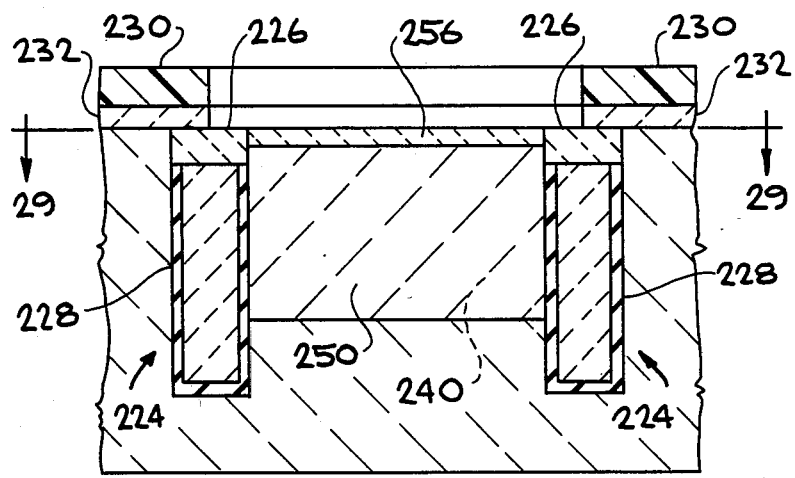
FIG. 28 is a fragmentary side section view of a subsequent step in forming the embodiment of FIG. 27.
Figure 29:
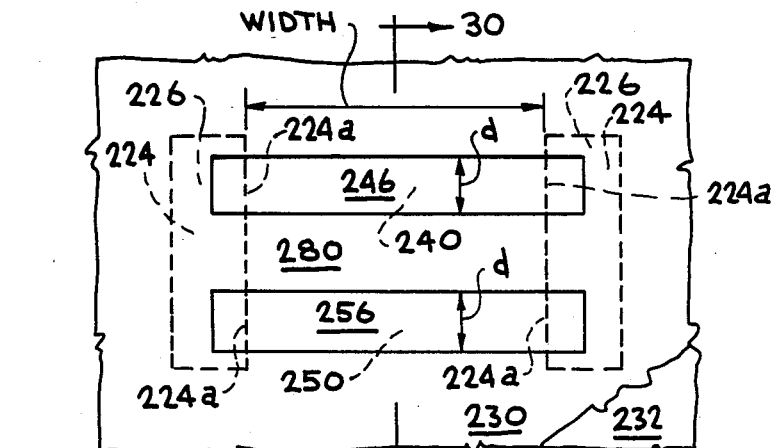
FIG. 29 is a fragmentary top view of the structure of FIG. 28 taken along lines 29—29.

The active electrode slots 240 and 250 are then formed as shown in FIGS. 28 and 29 by further patterning of nitride mask 232 and photoresist layer 230. As seen in FIG. 29, dimension d of the active device slots is controlled by nitride mask 232 while the other dimension of active device slots 240 and 250 e.g., the width, is defined by the dotted lines 224a representing the oxide side walls of isolation slot portions 224. After completion of the formation of electrodes in active device slots 240 and 250, oxide caps 246 and 256 are formed over the slot electrodes to provide self-alignment masks for the completion of the isolation slot which will surround the active device.

Figure 30:
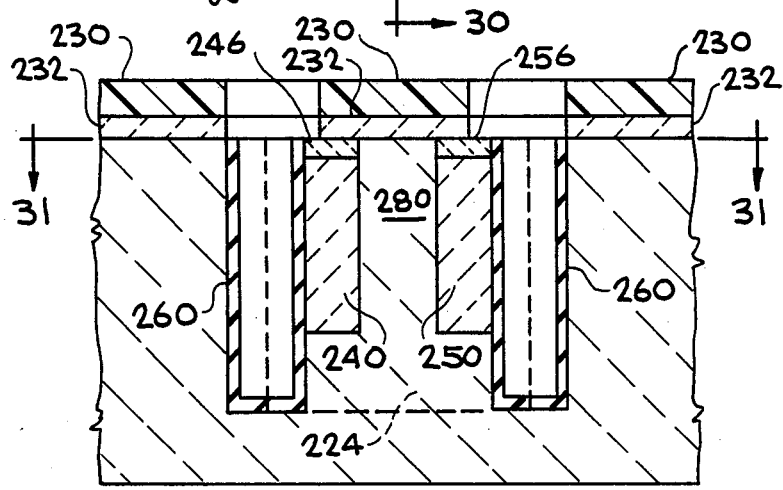
FIG. 30 is a fragmentary side section view of a further step in forming the embodiment of FIGS. 27–29.
Figure 31:
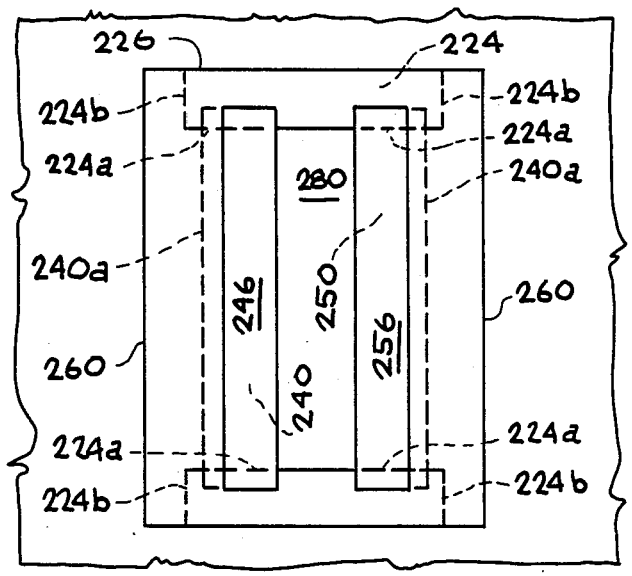
FIG. 31 is a fragmentary top view of the structure of FIG. 30 taken along lines 31—31.

The isolation slot is then completed to surround the active device formed in slots 240 and 250 as shown in FIGS. 30 and 31. However, in this instance, the dimensions of newly formed isolation slot portions 260 will be controlled, at least in part, by isolation slots portions 224 (as shown by dotted lines 224a and 224b) and in part by active device slots 240 and 250 (as seen by the dotted lines 240a and 250a).

In this manner, active electrode slots 240 and 250 are contiguously surrounded on their outer peripheries by the oxide walls of the isolation slot formed by portions 224 and 260 leaving only the space 280 in between the active electrode slots to thereby prevent end or edge effects as in the earlier described embodiments. However, in this embodiment, dimensional control of the active electrode slots is provided for in the width dimension by the initial spacing apart of isolation portions 224 and in the dimension d by the active device slot mask with the latter formed isolation portions 260 conforming to the already formed dimension d of the active device slots rather than vice versa as in the previously described embodiments.

Thus, the invention provides a compact integrated circuit structure of the slot electrode type wherein the walls of an isolation slot surrounding an active device form the outer wall or walls of the active device slots to both conserve space and reduce end or edge effects.

Having thus described the invention, what is claimed is:

1. A method of making a compact integrated circuit structure comprising an active device in one or more slots in a substrate characterized by reduced end effects which comprises:
   (a) forming one or more active device slots in a substrate;
   (b) forming an active device in said one or more active device slots;
   (c) forming an isolation slot in said substrate surrounding said one or more active device slots and having one wall thereof contiguous with the portion of the wall of said one or more active device slots facing said isolation slot.

2. The method of claim 1 wherein said step of forming said isolation slot includes the step of forming an insulation layer on the walls of said isolation slot.

3. The method of claim 2 wherein said substrate comprises silicon and said step of forming said insulation layer on the walls of said isolation slot comprises forming a layer of silicon oxide on the silicon walls of said isolation slot.

4. The method of claim 3 wherein step of forming said layer of silicon oxide on the walls of said isolation slot also comprises forming the wall of all of that portion of said one or more active device slots which face said surrounding isolation slot.

5. The method of claim 3 wherein said step of forming said isolation slot is performed prior to forming said one or more active device slots.

6. The method of claim 5 wherein said step of forming said isolation slot includes the further step of forming a protective cap over said isolation slot prior to forming said one or more active device slots wherein said protective cap comprises material resistant to a silicon etch.

7. The method of claim 6 wherein said step of forming said one or more active device slots further comprises the steps of:
   (a) forming a mask over said substrate, said mask including said protective cap; and
   (b) etching said silicon substrate to form at least one of said one or more active device slots;
   whereby the use of said protective cap as a portion of said mask provides a self-aligned structure wherein said silicon oxide on the walls of said isolation slot under said portion of said protective cap used as said mask will form the wall of said active device slot.

8. The method of claim 7 wherein said one or more active device slots comprise rectangles and said step of forming said mask for said one or more active device slots further comprises the use of said protective cap to form the mssk for three sides of at least two of said rectangular active device slots.

9. The method of claim 7 wherein said isolation slot comprises a rectangular shaped slot and said step of forming said isolation slot is partially performed prior to formation of said one or more active device slots by the steps of:
(a) forming two parallel but spaced apart isolation slots portions in said substrate;
(b) oxidizing the walls of said isolation slot portions; and
(c) forming said protective cap over said isolation slots;
whereby said protective caps on said two parallel but spaced apart isolation slot portions will provide masks for two parallel sides of subsequently formed active device slots.

10. The method of claim 9 wherein said one or more active device slots comprise rectangles and including the further steps of:
(a) forming said one or more rectangular active device slots between said previously formed parallel isolation slot potions using said protective caps over said slot portions as a portion of the mask to thereby control one dimension of said one or more rectangular active device slots and form two opposite walls of each of said one or more active device slots contiguous with said isolation slot portions;
(b) forming said active device in said one or more active device slots;
(c) forming a protective cap over said one or more active device slots comprising a material resistant to a silicon etchant; and
(d) forming second parallel isolation slot portions extending between said first isolation slot portions to form a rectangle surrounding said one or more active device slots using said protective cap over said one or more active device slots as a mask whereby each of said second isolation slot portions will be formed with a wall contiguous with said one or more active device slots.

11. A method of forming an integrated circuit structure comprising an active device formed in one or more active device slots in a substrate with one or more isolation slots formed in said substrate with all of the walls of said one or more active device slots facing said isolation slot being formed contiguous with at least a portion of said isolation slot which comprises:
(a) forming a rectangular isolation slot in said substrate;
(b) forming an insulation layer on at least the walls of said isolation slot;
(c) forming a protective layer over the top of said isolation layer comprising a material resistant to an etchant for said substrate;
(d) forming one or more active device slots in said substrate adjacent all portions of said isolation slot facing said one or more active device slots using said protective layer over said isolation slot as a self-aligning mask for said sides of said one or more active device slots facing said rectangular isolation slot to insure that said sides of said one or more active device slots facing said isolation slot will be formed contiguous with a portion of said isolation slot wall; and
(e) forming an active device in said one or more active device slots;
whereby said insulation on said wall of said isolation slot will form the sidewall of all sides of said one or more active device slots facing said isolation slot.

12. A method of making a compact integrated circuit structure comprising an active device in one or more slots in a silicon substrate characterized by reduced end effects which comprises:
(a) forming an isolation slot in said substrate;
(b) forming an insulation layer of silicon oxide on the silicon walls of said isolation slot;
(c) filling said isolation slot with polysilicon;
(d) forming a protective cap over said isolation slot prior to forming said one or more active device slots wherein said protective cap comprises material resistant to a silicon etch;
(e) forming one or more active device slots in said silicon substrate using said protective cap formed over said isolation slot as a self-aligning portion of an etch mask so that the portion of said one or more active device slots facing said isolation slot will be contiguous with said isolation slot; and
(f) forming an active device in said one or more active device slots;
where by said isolation slot will surround said one or more active device slots and said isolation slot will be contiguous with the portion of the wall of said one or more active device slots facing said isolation slot.

13. The method of claim 12 wherein said step of forming said protective cap over said isolation slot further comprises forming an oxide cap over said isolation slot.

14. The method of claim 13 including the further step of forming a nitride mask over said substrate after forming said oxide protective cap over said isolation slot, and forming an opening therein which will expose a portion of the silicon substrate within said isolation slot and also expose at least a portion of said oxide protective cap over said isolation slot; said nitride mask cooperating with said oxide protective cap to define a self-aligning mask for the formation of at least one active device slot in said substrate.

15. The method of claim 14 including the further steps, after formation of said at least one active device slot in said substrate, of:
(a) filling said at least one active device slot with polysilicon; forming an oxide layer over said polysilicon;
(b) removing exposed portions of said nitride mask to expose silicon substrate thereunder; and
(c) using said oxide protective cap over said isolation slot and the oxide over said previously formed and filled at least one active device slots as a self-aligning mask, forming a further active device slot in said silicon substrate having the portion of said further slot facing said isolation slot formed contiguous therewith because of said self-aligning mask.

16. A method of forming an integrated circuit structure comprising an active device formed in one or more active device slots in a substrate with one or more isolation slots formed in said substrate with all of the walls of said one or more active device slots facing said isolation slot being formed contiguous with at least a portion of said isolation slot which comoprises:
(a) forming a rectangular isolation slot in said substrate;

(b) forming an insulation layer on at least the walls of said isolation slot;

(c) forming a protective layer over the top of said isolation slot comprising a material resistance to an etchant for said substrate;

(d) forming a mask layer comprising a material resistant to an etchant for said substrate and said protective layer over said isolation slot, said mask layer defining an opening therein which exposes at least a portion of the silicon substrate bounded by said isolation slot and also exposes at least a portion of said protective layer over said isolation slot;

(e) forming one or more active device slots in said substrate adjacent all portions of said isolation slot facing said one or more active device slots using said protective layer over said isolation slot as a self-aligning mask for said sides of said one or more active device slots facing said rectangular isolation slot to insure that said sides of said one or more active device slots facing said isolation slot will be formed contiguous with a portion of said isolation slot wall; and (f) forming an active device in said one or more active device slots;

whereby said insulation on said wall of said isolation slot will form the sidewall of all sides of said one or more active device slots facing said isolation slot.

* * * * *